United States Patent [19]

Guizerix et al.

[11] Patent Number: 4,972,510
[45] Date of Patent: Nov. 20, 1990

[54] METHOD AND APPARATUS FOR SQUELCHING DEPENDENT ON DETECTED BOND RATE TO REDUCE UNWANTED AUDIBLE NOISE ON A MIXED VOICE DATA CHANNEL

[75] Inventors: David J. Guizerix, Boynton Beach, Fla.; Linda M. Trine, North Ridgeville, Ohio; William G. Siegel, West Palm Beach, Fla.

[73] Assignee: Motorola, Inc., Schaumburg, Ill.

[21] Appl. No.: 394,460

[22] Filed: Aug. 16, 1989

[51] Int. Cl.$^5$ .............................................. H04B 1/10
[52] U.S. Cl. .................................... 455/212; 455/218; 455/229; 370/84; 375/104
[58] Field of Search ................. 455/35, 212, 218, 219, 455/220, 221, 222, 228; 375/104; 340/825.44, 825.48; 370/84

[56] References Cited

U.S. PATENT DOCUMENTS

| | | | |
|---|---|---|---|
| 3,927,376 | 12/1975 | Ferrie | 455/218 |
| 4,424,514 | 1/1984 | Fennell et al. | 340/825.44 |
| 4,431,991 | 2/1984 | Bauley et al. | 340/825.44 |
| 4,825,193 | 4/1989 | Siwiak et al. | 340/825.44 |

FOREIGN PATENT DOCUMENTS 8301875  5/1983  World Int. Prop. O. ............ 455/38

Primary Examiner—Reinhard J. Eisenzopf
Assistant Examiner—Lisa Charouel
Attorney, Agent, or Firm—Daniel R. Collopy; Vincent B. Ingrassia; William E. Koch

[57] ABSTRACT

Unwanted audible noise on a mixed voice data channel is reduced by disabling an audio output device in a radio receiver or transceiver when the receiver determines that the RF signal received contains binary digital bit data. Alternatively, the receiver enables the audio output device when it determines that the RF signal received does not contain binary digital bit data.

4 Claims, 4 Drawing Sheets

METHOD AND APPARATUS FOR SQUELCHING DEPENDENT ON DETECTED BOND RATE TO REDUCE UNWANTED AUDIBLE NOISE ON A MIXED VOICE DATA CHANNEL

FIELD OF THE INVENTION

This invention relates in general to radio receivers and transceivers, and in particular to a method and apparatus for reducing aubible noise output from a radio receiver transceiver.

BACKGROUND OF THE INVENTION

In standard two-way radio transceivers, all audible signals received by the radio receiver are transmitted out the radio speaker. The transmission of binary digital paging messages on a mixed voice data channel produces unnecessary audible noise on the radio speaker for the holder of the radio, especially in busy systems. With transceivers designed to also receive binary digital paging messages, more paging messages appear within the mixed voice data channel thereby increasing the unnecessary audible noise on the radio speaker.

Through the use of two-way radio transceivers with Private Line (PL) or Digital Private Line (DPL) capability, the unnecessary audible noise can be reduced. PL radio systems send out a low frequency tone for the duration of the message. The frequency of the low frequency tone indicates to the various radio receivers which are to receive the message. A receiver will only key up to receive a message if it is receiving an identified tone. The receiver shuts off when the tone is no longer received. DPL radio systems preface each message with a short burst of digital data to notify which receiver should receiver the message. If the receiver matches the digital data with a digital code stored internally, the receiver will key up and receive the message. At the end of a transmission, the inverse of the digital data code will be sent, shutting off the receiver.

To install PL and DPL capabilities in a radio receiver, extra circuitry must be purchased and installed within the receiver. Further, PL radio systems cannot receive a binary digital paging message because of the restrictions built into the PL systems. Therefore, while PL and DPL radio systems will reduce unnecessary audible noise broadcast through a radio receiver speaker, these systems require additional circuitry and the addition of PL circuitry renders the receiver incapable of receiving a paging message.

Thus, what is needed is a method for enabling the audio output to the radio speaker for nonbinary signals and disabling the audio output to the radio speaker for binary signals while allowing for the reception and decoding of binary digital paging messages.

SUMMARY OF THE INVENTION

Accordingly, it is an object of the present invention to provide a method for disabling the speaker of a radio receiver upon determination that the information being received is a binary digital signal.

It is also an object of the present invention to provide a method for eliminating the audio output of binary digital paging messages yet allowing the reception and decoding of binary digital paging messages.

It is a further object of the present invention to provide an apparatus to be installed within a radio receiver or transceiver for disabling the speaker upon determination that the information being received is a binary digital signal comprising little or no extra parts and no dedicated circuitry.

In carrying out the above and other objects of the invention in one form, there is provided an apparatus comprising a receiver for receiving an RF signal and a microprocessor. The microprocessor determines whether the RF signal is a binary digital signal and enables an audio output device if the RF signal is determined not to be a binary digital signal.

The above and other objects, features, and advantages of the present invention will be better understood from the following detailed description taken in conjunction with the accompanying drawings.

DETAILED DESCRIPTION OF THE INVENTION

Figure 1:
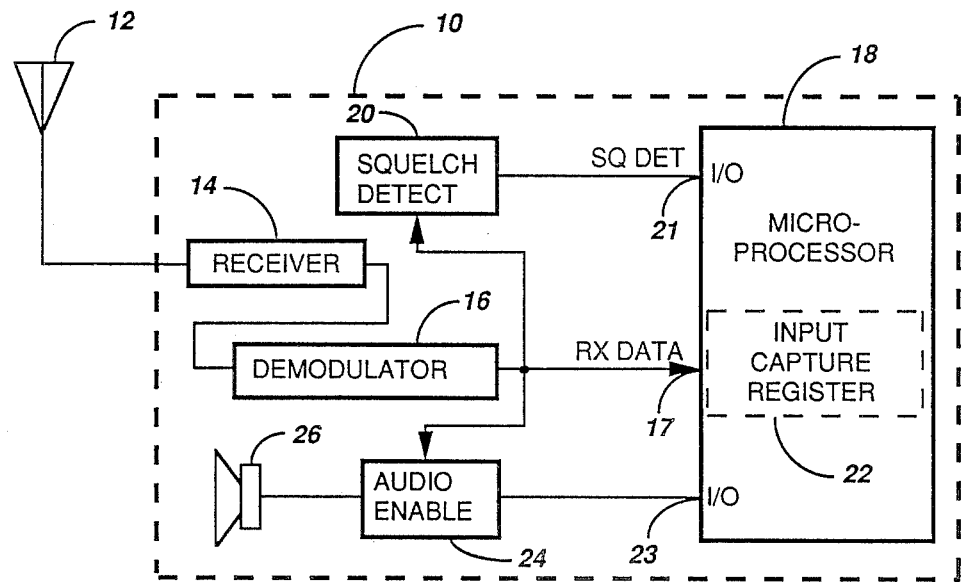
FIG. 1 is a block diagram of radio transceiver according to the present invention.

Referring to FIG. 1, a radio transceiver 10 receives RF signals on a mixed voice data channel via an antenna 12 and a receiver 14. Demodulator 16 demodulates the RF signal and routes the demodulated signal RX DATA to a data port 17 of a microprocessor 18. The demodulated signal is also routed to a squelch detect device 20 which provides an input signal SQ DET to an input/output (I/O) port 21 of the microprocessor 18. An input capture register 22 within the micorprocessor 18 receives the RX DATA signal as an input and stores a clock value each time the input capture register interrupt is activated upon detection of a rising or falling edge of the signal RX DATA. The microprocessor 18 performs a bit synchronization determination routine utilizing the stored clock values within input capture register 22 to determine if the signal RX DATA is a binary bit signal. If the demodulated signal is determined to be a binary bit signal, the microprocessor 18 performs the page decoding by processing the binary values through software within the microprocessor 18. If the microprocessor 18 has determined that the signal RX DATA is not a binary signal, the microprocessor 18 provides an output signal from I/O port 23 to an audio enable device 24 enabling the demodulated signal to be provided to an audio output device 26, such as a speaker. Alternatively, the audio enable device 24 could be configured such that an output signal provided from I/O port 23 if the demodulated signal were determined to be a binary bit signal would disconnect the audio output device 26, disabling the demodulated signal provided.

Figure 2:
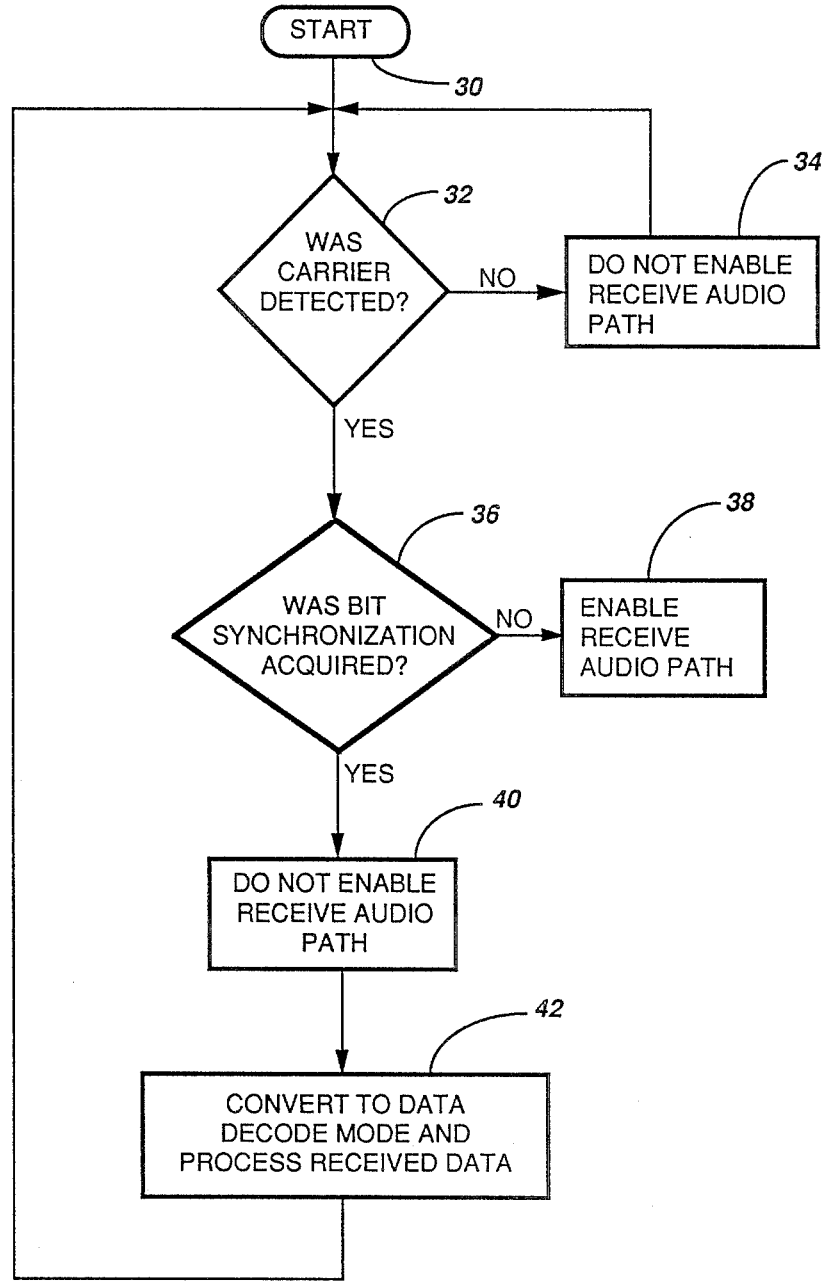
FIG. 2 is a flow chart of the operation of the present invention.

Referring to FIG. 2, a flow chart of the method of the present invention to reduce unwanted audible responses on a mixed voice data channel is described. Immediately after the power is switched on 30 to the radio transceiver 10 (FIG. 1), the transceiver begins looking for a carrier signal indicative of the mixed voice data channel to which the transceiver is tuned 32. If the carrier signal is not detected, the audio path which routes the RF signal received to the audio output device 26 (FIG.1) is not enabled 34. FIG. 2 describes the method of enabling the audio path. If the audio enable device 24 (FIG. 1) were configured in the alternative mode described above, the audio path would be disabled at step 34 and subsequent enable and not enable steps would become not disable and enable. The transceiver returns to step 32 and continues looking for the carrier signal.

If the carrier is detected, microprocessor 18 (FIG. 1) begins processing the demodulated signal to acquire bit sychronization 36. If bit synchronization is not acquired, the audio path is enable 38. If bit sychronization is acquired, the audio path is not enabled 40 and the transceiver converts to a binary bit data decode mode and processes the received binary digital signal 42 through data decoding software in the microprocessor 18 (FIG. 1). The operation of the transceiver then returns to step 32 to begin looking again for a carrier signal indicative of the mixed voice data channel to which the transceiver is tuned.

Figure 3A:
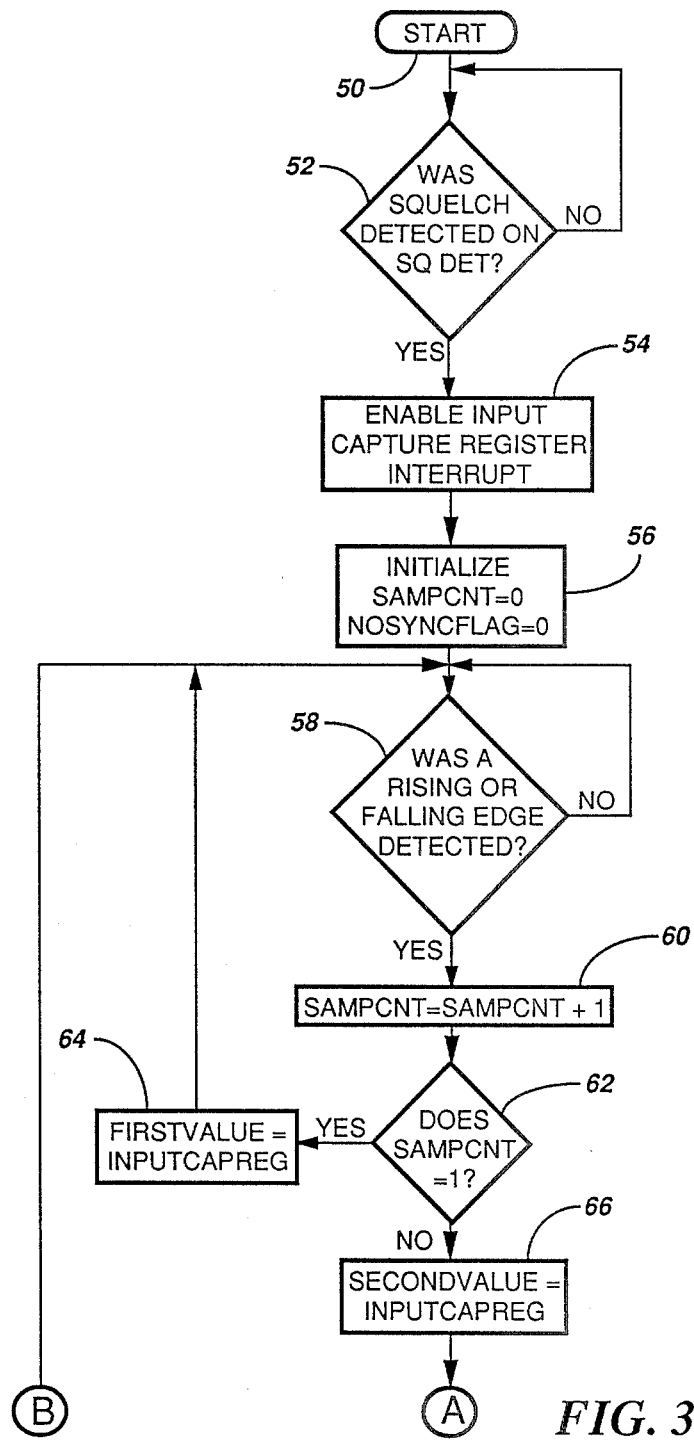
FIG. 3 is a flow chart of the operation of the bit synchronization determination routine according to the present invention.
Figure 3B:
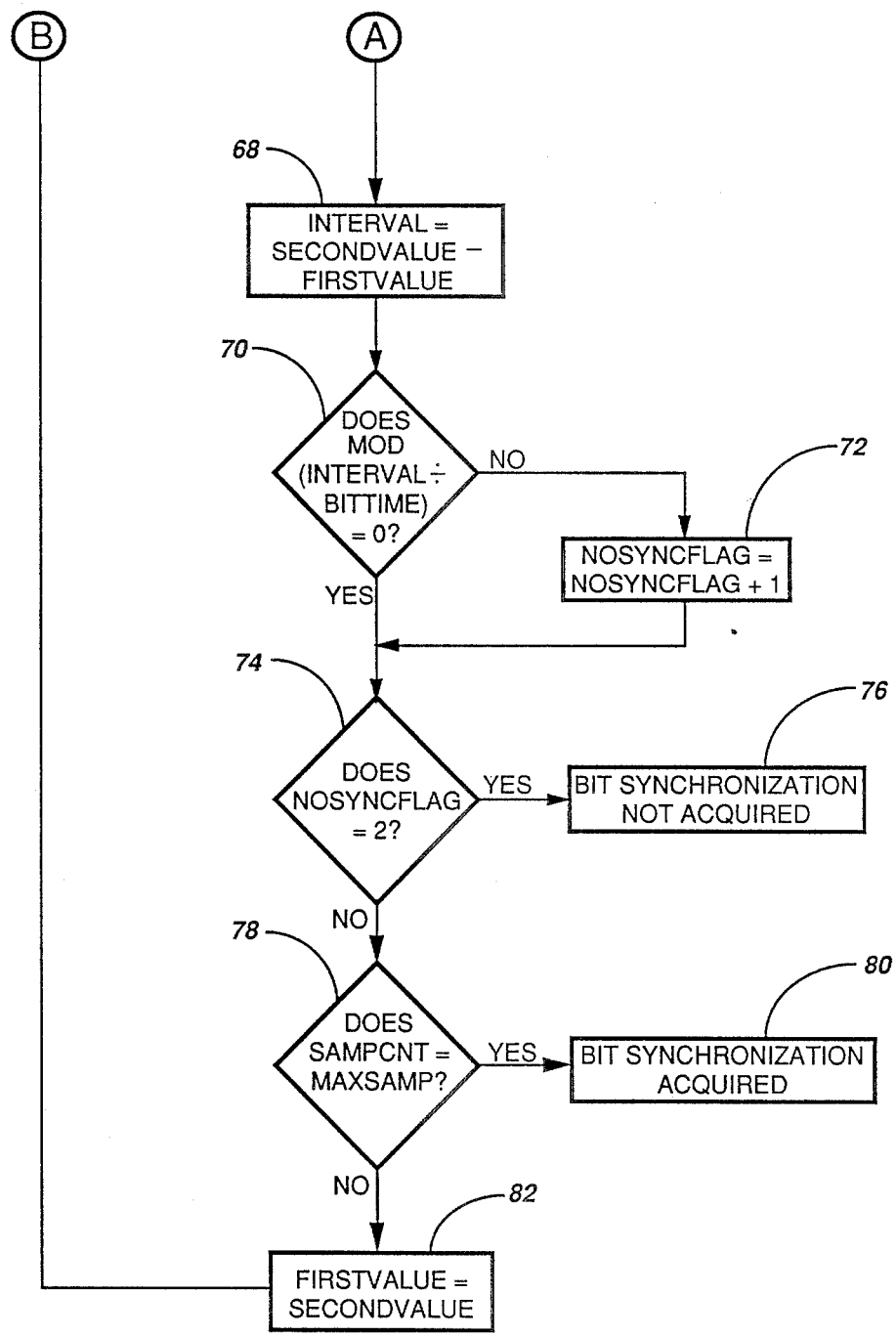

Referring to FIGS. 3A and 3B, a flowchart of the method for the determination of bit synchronization acquisition is described. Once carrier is detected 32 (FIG. 2) the bit synchronization determination routine is begun 50. The microprocessor 18 (FIG. 1) will await a reception of a squelch detect signal 52. Once a squelch detect signal is received, the interrupt for the input capture register 22 (FIG. 1) will be enabled 54 to being sampling rising and falling edges within input signal RX DATA. SAMPCNT, a variable which counts the number of samples processed, and NOSYNCFLAG, a variable which counts the number of samples which do not result in bit sychronization are initialized to zero 56. The input capture register begins sampling RX DATA for rising and falling edges 58. When a rising or falling edge is detected SAMPCNT is incremented by one 60. On the first pass through the routine (SAMPCNT equals one) 62, a variable FIRSTVALUE is set equal to INPUTCAPREG, the clock value latched in the input capture register when either a rising or falling edge is detected within RX DATA, 64 and RX DATA is sampled for the next rising or falling edge 58.

On subequent passes where SAMPCNT does not equal one 62, the variable SECONDVALUE is set equal to INPUTCAPREG. INTERVAL, the time interval between rising and falling edges, is calculated by subtracting FIRSTVALUE from SECONDVALUE 68. A constant BITTIME representing a binary bit rate time has a value dependent upon the system clock. Whether INTERVAL is a valid binary bit rate time such as 300 baud or 1200 baud is determined by performing a modulus operator MOD on INTERVAL and BITTIME 70. Through the use of several constants BITTIME(A) through BITTIME(N), the routine could determine valid bit sychronization with several bit rates on the same channel with only additional steps 70a through 70n to perform the modulus operator MOD on the ratio of INTERVAL to each of the constants BITTIME(A) through BITTIME(N).

MOD returns the remainder of INTERVAL divided by BITTIME. If the remainder is not zero 70, NOSYNCFLAG is incremented by one 72. Next, NOSYNCFLAG is checked to see if it is equal to two 74. If NONSYNCFLAG equals two indicating the INTERVAL has twice not been a valid binary bit time rate, bit synchronization has not been acquired 76 and the receive audio path is enabled 38 (FIG. 2). SAMPCNT is checked to see if the number of rising and falling edges successfully examined is equal to a constant MAXSAMP which indicates how many samples the routine will examine before declaring bit synchronization 78. MAXSAMP should be set to an integer, for example eight, sufficiently large that the number of samples reliably indicate valid acquisition of bit synchronization. If SAMPCNT equals MAXSAMP, bit sychronization is acquired 80 and the receive audio path is disabled 40 (FIG. 2). If SAMPCNT does not equal MAXSAMP, FIRSTVALUE is set equal to SECONDVALUE 82 and the routine proceeds to measure the time interval until the next rising or falling edge is detected 58.

By now it should be appreciated that there has been provided method and apparatus for enabling the audio output to the radio speaker for nonbinary signals and disabling the audio output to the radio speaker of binary signals while allowing for the reception and decoding of binary digital messages.

We claim:

1. An apparatus for controlling an audio output device of a radio transceiver comprising:
   first means for receiving an RF signal;
   second means for detecting whether said signal has a binary baud rate; and
   third means responsive to said second means for selectively enabling said audio output if said signal does not have a binary baud rate.

2. An apparatus for controlling an audio output device of a radio transceiver comprising:
   first means for receiving an RF signal;
   second means for detecting whether said signal has a binary baud rate; and
   third means responsive to said second means for selectively disabling said audio output if said signal has a binary baud rate.

3. The apparatus of claim 1 wherein said second means comprises:
   baud rate detection means for acquiring bit synchronization with said signal; and
   control means for determining said signal does not have a binary baud rate if said baud rate detection means has not acquired bit synchronization within a predetermined time duration.

4. The apparatus of claim 2 wherein said second means comprises:
   baud rate detection means for acquiring bit synchronization with said signal; and
   control means for determining said signal does have a binary baud rate if said baud rate detection means acquires bit synchronization with said signal.

* * * * *

UNITED STATES PATENT AND TRADEMARK OFFICE
CERTIFICATE OF CORRECTION

PATENT NO. : 4,972,510

DATED : Nov. 20, 1990

INVENTOR(S) : David J. Guizerix, Linda M. Trine, William G. Siegel

It is certified that error appears in the above-identified patent and that said Letters Patent is hereby corrected as shown below:

In the Title, please change "BOND" to -- BAUD --.

Signed and Sealed this

Ninth Day of April, 1991

Attest:

HARRY F. MANBECK, JR.

*Attesting Officer*      *Commissioner of Patents and Trademarks*